United States Patent [19]

Soelkner

[11] Patent Number: 5,164,664
[45] Date of Patent: Nov. 17, 1992

[54] METHOD FOR THE OPTICAL MEASUREMENT OF ELECTRICAL POTENTIALS

[75] Inventor: Gerald Soelkner, Ottobrunn, Fed. Rep. of Germany

[73] Assignee: Siemens Aktiengesellschaft, Munich, Fed. Rep. of Germany

[21] Appl. No.: 687,180

[22] Filed: Apr. 18, 1991

[30] Foreign Application Priority Data

Oct. 9, 1990 [DE] Fed. Rep. of Germany ....... 4032031

[51] Int. Cl.$^5$ ............................................. G01R 31/28
[52] U.S. Cl. ................................... 324/158 R; 324/96
[58] Field of Search ............. 324/96, 158 R; 359/246, 359/252, 257, 315

[56] References Cited

U.S. PATENT DOCUMENTS 5,006,789 4/1991 Williamson ......................... 359/257
5,034,683 7/1991 Takahashi et al. ..................... 324/96

OTHER PUBLICATIONS

IEEE Journal of Quantum Electronics, vol. QE-22, No. 1, Jan., 1986, "Subpicosecond Electrooptic Sampling: Principles and Applications", by Janis A. Valdmanis et al., pp. 69–78.

Electronics Letters, 14th Aug. 1986, vol. 22, No. 17, "Noncontact Electro-Optic Sampling with a GaAsInjection Laser", by J. Nees et al., pp. 918–919.

*Primary Examiner*—Ernest F. Karlsen
*Attorney, Agent, or Firm*—Hill, Van Santen, Steadman & Simpson

[57] ABSTRACT

The optical absorption edge of a semiconductor is shifted toward lower photon energies in an electrical field. The method of the invention utilizes this electroabsorptive effect in order to measure electrical signals of microelectronics in an optical way. A plate-shaped member arranged immediately above the component and scanned by a laser beam serves as a measuring sensor. This plate-shaped member is composed of a carrier crystal which is transparent for the radiation employed, of a conductive layer which is likewise transparent, and of a semiconductor which is dielectrically mirrored at the specimen side, the absorption behavior thereof being influenced by the electrical stray fields emanating from the interconnects. The measured quantity is the intensity of the laser radiation reflected at the dielectric mirror and deflected in the direction of a photodiode.

8 Claims, 1 Drawing Sheet

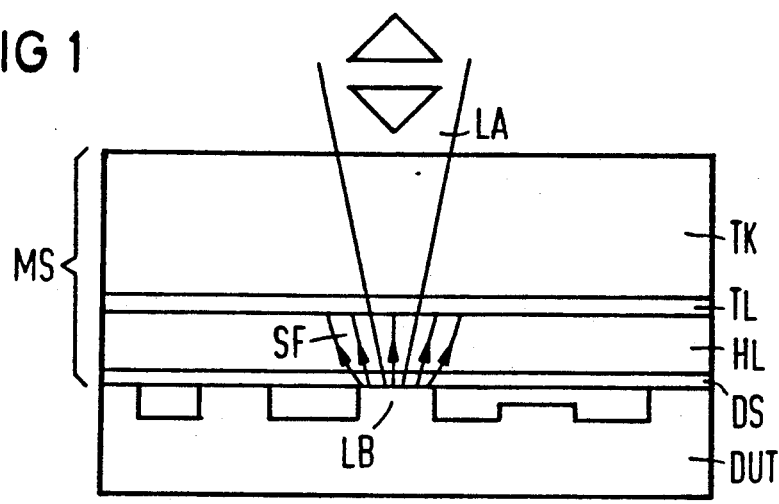
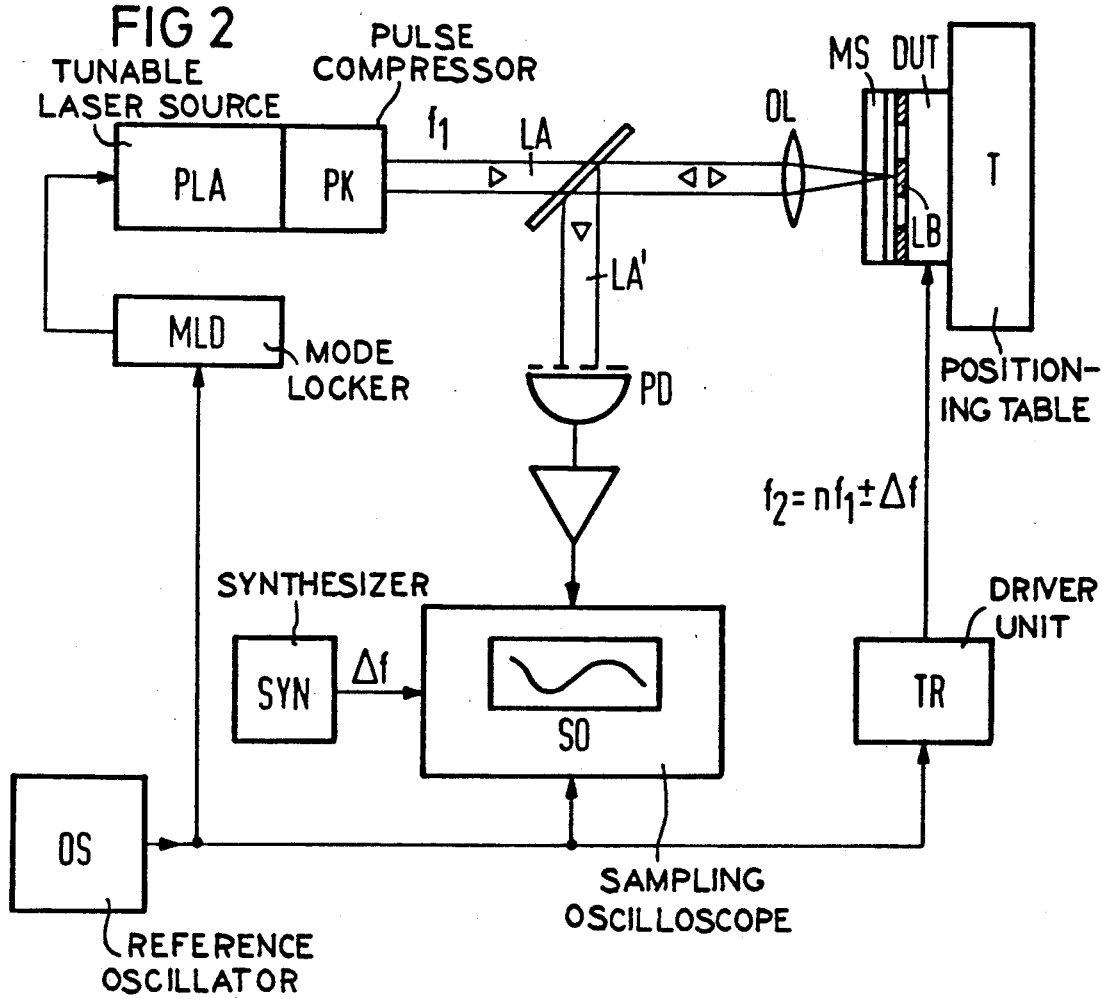

METHOD FOR THE OPTICAL MEASUREMENT OF ELECTRICAL POTENTIALS

RELATED APPLICATION

The present application is related to copending application, Ser. No. 687,020, filed Apr. 18, 1991, entitled "METHOD FOR MEASURING ELECTRICAL POTENTIALS IN A SEMICONDUCTOR COMPONENT", inventor Gerald Soelkner.

BACKGROUND OF THE INVENTION

The invention is directed to a method for optically measuring electrical potentials.

The method known from Electronics Letters, Vol. 21, No. 13 (1985), pages 568–579, incorporated herein, uses a crystal plate having electro-optical properties, and which is dielectrically mirrored on one side in order to image the distribution of potential in microelectronics components with the assistance of a laser probe. Since the measuring sensor scanned point-by-point by the probe is arranged immediately above the component, the electrical stray fields emanating from the interconnects can penetrate into the crystal and induce birefringence therein. The change in the polarization of the laser radiation which penetrates the crystal in the region of the stray field that is thereby caused is documented in an analyzer unit and registered, dependent on the location of the laser focus on the component surface.

Whereas the measuring method known from Electronics Letters, Vol. 20, No. 20 (1984), pages 818 and 819, from Appl. Phys. Letters 47 (10), 1985, pages 1083–1084 and from U.S. Pat. No. 4,681,449, all incorporated herein, utilizes the electro-optical properties of the substrate material for registering changes in signal level in GaAs circuits, the method described in Electronics Letters, Vol. 22, No. 17 (1986), pages 918–919, incorporated herein, uses a LiTaO$_3$ crystal tip in order to stroboscopically sample the electrical fields occurring in the region of the interconnects with the assistance of a laser probe which penetrates the crystal tip.

Further laser measuring methods are disclosed in IEEE Journal of Quantum Electronics, Vol. 22, No. 1, 1986, pages 69–78, incorporated herein.

SUMMARY OF THE INVENTION

An object of the invention is to specify a method of the type initially cited with which potentials, particularly potentials in components of microelectronics, can be measured with great precision.

According to the method for optical measurement of electrical potentials according to the invention, a semiconductor body is arranged in a region of a specimen having a potential to be measured such that an electrical stray field emanating from the region penetrates at least partially into the semiconductor member. A change in absorption behavior of the semiconductor material of the semiconductor member induced by the electrical stray field is identified with the assistance of a monochromatic light probe which penetrates the electrical stray field.

A particular advantage obtainable with the invention is that the time-dependency of electrical potentials can be identified in an uninfluenced manner by the surface structure in the region of the measuring point.

BRIEF DESCRIPTION OF THE DRAWINGS

FIG. 1 illustrates a cross section through the measuring sensor arranged above the component under investigation; and FIG. 2 shows a schematic structure of an apparatus for the implementation of the method.

DESCRIPTION OF THE PREFERRED EMBODIMENTS

The optical absorption edge of a semiconductor is shifted toward lower photon energies in an electrical field (Franz Keldysh effect). The method of the invention utilizes this electroabsorptive effect in order to measure electrical potentials with the assistance of a laser probe. A noticeable attenuation of monochromatic light having the energy $E_{ph} \lesssim E_B$ ($E_B$ is the band gap of the semiconductor), however, is only observed beginning at high field strengths of approximately 10 kV/cm. Since electrical fields of this order of magnitude occur in submicrometer structures even at low potentials, the method of the invention is particularly suited for measuring fast changes in signal levels at interconnects of modern VLSI circuits.

The plate-shaped body MS shown in FIG. 1, which is arranged immediately above the component DUT and is scanned with a laser beam LA, serves as a measuring sensor. The measuring sensor MS is composed of a YAG carrier crystal TK that is transparent for the radiation LA employed, of a conductive layer TL (for example, tin oxide) that is likewise transparent, and of a layer of undoped semiconductor HL which is dielectrically mirrored at the specimen side and whose absorption behavior is influenced by the electrical stray fields SF emanating from the interconnects or signal carrying components LB. CdS (absorption at 0.5 μm) and ZnS (absorption at 0.3 μm) particularly come into consideration as semiconductor materials. The dimensions and thicknesses of the sensor components are to be matched to the experimental conditions.

The following layer thicknesses d have proven advantageous for the investigation of component DUT having an active area of approximately 1×1 cm$^2$:

| | |
|---|---|
| carrier crystal TK | $d_{TK} \approx 0.5$ mm |
| conductive layer TL | $d_{TL} \approx 100$ nm |
| semiconductor layer HL | $d_{HL} \gtrsim 50$ μm |
| dielectric mirror DS | $d_{DS} \approx 10$ μm |

The measuring sensor MS should be brought optimally close to the component DUT, and in particular, is placed on the surface thereof, so that the electrical stray fields SF penetrate the semiconductor HL nearly perpendicularly above the signal-carrying components LB. The absorption behavior of the semiconductor HL is then dependent only on the respective interconnect potential, or on the difference in potential built up between the interconnect HL and the conductive layer TL. Changes in signal level can therefore be identified in an uninfluenced manner by the structure of the surface in the region of the measuring point. These changes are identified with the assistance of the laser probe LA positioned to the interconnect LB of interest. The measured quantity is thus the intensity of the radiation reflected at the dielectric mirror DS and deflected in the direction of a detector (see FIG. 2). A photodiode PD serves as the detector, the output signal thereof being amplified and further processed in a sampling oscilloscope SO (Le Croy 9400).

The probe-shaping part of the apparatus is composed of a tunable picosecond laser source PLA (pulse repetition rate $f_1 = 82$ MHz, pulse width $\tau \approx 100$ ps), of a pulse compressor PK for diminishing the width of the laser pulses to $\tau < 10$ ps, as well as of an optical unit OL which focuses the laser radiation LA onto the interconnect LB of interest in the component DUT arranged on a positioning table T. The wavelength of the radiation LA emitted by the laser source PLA is thus tuned to the absorption edge of the semiconductor HL employed in the measuring sensor MS such that every change in the potential of the interconnect produces an optimally great change in the intensity of the reflected laser radiation LA'. This is particularly guaranteed when the photon energy is less than and approximately equal to the band gap of the semiconductor HL. Of course, the energetic position of the absorption edge can also be tuned to the wavelength of the laser radiation LA by varying the potential of the conductive layer TL.

The apparatus for the implementation of the method also contains a driver unit TR which initiates the component DUT to periodically work off a test program. When the drive frequency $f_2$ prescribable by the driver unit TR corresponds to a whole multiple n of the pulse repetition rate $f_1$ of the radiation source PLA, the laser probe LA samples the interconnect signals appearing during a test cycle in-phase within every $n^{th}$ period (stroboscopy principle). In order to completely register the time-dependency of the signals, a drive frequency $f_2 = nf_1 \pm \Delta f$ ($f_1 >> \Delta f \approx 1$ kHz) is selected, so that the phase relation of the laser pulses with respect to the interconnect signals continuously changes.

A signal having the sampling frequency established by $\Delta f$ is also present at the reference input of the oscilloscope SO. This signal is generated with a synthesizer SYN which, just like the driver unit TR and like the "mode locker" MLD which drives the laser source PLA, is synchronized by the output signal of a phasestable reference oscillator OS.

The invention, of course, is not limited to the exemplary embodiments set forth herein. Thus, the laser PLA, which emits in pulse-shaped manner, can be replaced by a unit composed of a cw laser and of an electro-optical modulator (Pockels cell). Thus, the pulse generator allocated to the modulator is again synchronized with the assistance of the reference oscillator OS.

It can be advantageous for an easier tuning of the wavelength of the probe LA which scans the measuring sensor MS to the absorption edge of the semiconductor HL, to arrange a frequency-doubling crystal in the beam path between the laser and the component.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for optical measurement of electrical potentials, comprising the steps of:
   arranging a semiconductor body in a region of a specimen having a potential to be measured such that an electrical stray field emanating from said region penetrates at least partially into said semiconductor body;
   identifying a change in absorption behavior of semiconductor material of the semiconductor body induced by the electrical stray field with assistance of a monochromatic light probe which penetrates the electrical stray field; and
   identifying said change in absorption behavior by identifying a shift of an absorption edge of the semiconductor material by measuring an intensity of the light probe.

2. A method according to claim 1 including the step of employing light whose photon energy is approximately equal to or lower than a band gap of the semiconductor material.

3. A method according to claim 1 including the steps of:
   mirroring an area of the semiconductor body at a side where the specimen is located; and
   positioning the light probe so that it penetrates the semiconductor body approximately perpendicularly to a surface of the specimen.

4. A method according to claim 1 including the step of providing a side of the semiconductor body facing away from the specimen with a conductive layer which is transparent for the light probe employed.

5. A method according to claim 4 including the step of charging the conductive layer with a variable potential.

6. A method according to claim 1 including the steps of:
   directing the light probe onto an element of the specimen which carries a periodic electrical signal and is gated in synchronism with said signal;
   pulsing the light probe; and
   varying a phase relationship of the light pulses relative to the electrical signal.

7. A method according to claim 1 including the step of employing a tunable laser as said light probe.

8. A method for optical measurement of electrical potentials, comprising the steps of:
   arranging a semiconductor body adjacent to a surface of a specimen having a potential to be measured such that an electrical stray field emanating from said region penetrates at least partially into said semiconductor body;
   providing a dielectric mirror layer between the specimen surface and the semiconductor body;
   identifying a change in absorption behavior of semiconductor material of the semiconductor body induced by the electrical stray field with assistance of a monochromatic light probe which penetrates the electrical stray field; and
   identifying said change in absorption behavior by identifying a shift of an absorption edge of the semiconductor material by measuring an intensity of the light probe.

* * * * *